United States Patent [19]
Matsumoto et al.

[11] 4,443,886
[45] Apr. 17, 1984

[54] CHARGE TRANSFER DEVICE IMAGER WITH BIAS CHARGE

[75] Inventors: Hiroyuki Matsumoto, Atsugi; Motoaki Abe, Hiratsuka; Tetsuo Ando, Ebina, all of Japan

[73] Assignee: Sony Corporation, Tokyo, Japan

[21] Appl. No.: 318,436

[22] Filed: Nov. 5, 1981

[30] Foreign Application Priority Data

Nov. 7, 1980 [JP] Japan .................................. 55-157437

[51] Int. Cl.³ ........................ G11C 19/28; H01L 29/78
[52] U.S. Cl. ............................................. 377/58; 357/24
[58] Field of Search ........................ 357/24, 30; 377/58

[56] References Cited
U.S. PATENT DOCUMENTS

| | | | |
|---|---|---|---|
| 3,925,657 | 12/1975 | Levine | 357/24 LR |
| 3,931,465 | 1/1976 | Levine | 357/24 LR |
| 4,032,948 | 6/1977 | Engeler et al. | 357/24 R |
| 4,328,432 | 5/1982 | Yamazaki | 357/24 LR |

Primary Examiner—Gene M. Munson
Attorney, Agent, or Firm—Hill, Van Santen, Steadman & Simpson

[57] ABSTRACT

In a charge transfer device in which a plurality of electrodes are located on an insulating layer formed on a semiconductor substrate and an input portion and a transfer portion are provided, a predetermined amount of charge determined by a potential applied to the input portion is introduced into the portion beneath a predetermined electrode while driving an electrode on the transfer portion, such a potential is applied to all of the plurality of electrodes that surface areas of the substrate beneath the electrodes each become an accumulation state to thereby inject the predetermined amount of charge into the substrate, and a potential is applied to the electrodes after a predetermined period of time to partially catch injected charge beneath the electrodes and to use caught charge as a bias charge.

A solid state image pick-up apparatus is also disclosed which includes the above-mentioned charge transfer device and carries out their operation in the vertical blanking period.

2 Claims, 12 Drawing Figures

CHARGE TRANSFER DEVICE IMAGER WITH BIAS CHARGE

BACKGROUND OF THE INVENTION

1. Field of the Invention

The present invention relates generally to a charge transfer device, and is directed more particularly to a charge transfer device suitable for use in a CCD (charge coupled device) solid state image pick-up element.

2. Description of the Prior Art

In general, a CCD solid state image pick-up element of a surface channel type is introduced with a bias charge of fat "0" so as to reduce the influence by its surface state. It is, however, difficult to introduce the bias charge to respective registers of the element uniformly and hence the apply of the bias charge may cause a fixed pattern noise. By way of example, in case of a CCD solid state image pick-up element of a frame transfer system, the fact that the image portion thereof is made as the surface channel type simplifies the wafer process thereof and requires no special counter means for the blooming control. However, on the other hand, the pick-up element is easily affected by the surface state and hence the transfer efficiency thereof is apt to be deteriorated. To cope with the above defect, in the prior art, the following methods are well known so as to apply the bias charge of fat "0". One of the methods utilizes a light through a photo-diode or the like so as to apply the bias charge, and another of the methods is to provide a diffusion layer at the input portion of the image pick-up element through which the bias charge is applied electrically. By the method using the light, however, since the light is incident on the side of the pick-up element, the light intensity is different between the peripheral portion and central portion of the pick-up element, which will generate a so-called shading. While according to the method to electrically apply the bias charge through the input portion directly, as shown in FIGS. 1A and 1B, the scattering of the surface potentials at the input gate make bias charge amounts $Q_A$ and $Q_A'$ of respective registers different, which will appear on a picture screen as thin longitudinal lines of a fixed pattern noise, so that it is desired to apply the fat "0" uniformly to the registers. FIG. 1A shows a register in which the surface potential at the input gate is uniform, while FIG. 1B shows a register in which the surface potential at the input gate is scattered.

OBJECT AND SUMMARY OF THE INVENTION

Accordingly, an object of the present invention is to provide a novel charge transfer device for use in a CCD solid state image pick-up element.

Another object of the invention is to provide a charge transfer device by which fat "0" can be uniformly applied to respective register of an image pick-up apparatus.

A further object of the invention is to provide a solid state image pick-up apparatus having a novel charge transfer device in which the respective operations of the charge transfer device are carried out within the vertical blanking period.

According to an aspect of the present invention, there is provided a charge transfer device in which a plurality of electrodes are located on an insulating layer on a semiconductor substrate and an input portion and a transfer portion are provided, said charge transfer device, comprising:

(a) means for introducing a predetermined amount of charge determined by a potential applied to the input portion into a portion beneath a predetermined electrode while driving an electrode on the transfer portion;

(b) means for applying such a potential to all of said plurality of electrodes that surface areas beneath said electrodes each become an accumulation state to thereby inject all of charge into substrate;

(c) means for applying a potential to said electrodes after a predetermined period of time to partially catch injected charge beneath said electrodes and to use caught charge as a bias charge.

According to another aspect of the present invention there is provided a solid state image pick-up apparatus, which comprises:

(a) a semiconductor substrate coated with an insulating layer on its one surface;

(b) a plurality of electrodes located on said insulating layer;

(c) an input portion;

(d) a transfer portion;

(e) means for introducing a predetermined amount of charge determined by a potential applied to the input portion into a portion beneath a predetermined electrode while driving an electrode on the transfer portion;

(f) means for applying such a potential to all of said plurality of electrodes that surface areas beneath said electrodes each become an accumulation state to thereby inject all of charge into said substrate; and (g) means for applying a potential to said electrodes after a predetermined period of time to partially catch injected charge beneath said electrodes and to use caught charge as a bias charge, wherein said three means carry out operations thereof in a vertical blanking period.

The other objects, features and advantages of the present invention will become apparent from the following description taken in conjunction with the accompanying drawings through which the like references designate the same elements and parts.

DESCRIPTION OF THE PREFERRED EMBODIMENT

The present invention will be hereinbelow described with reference to the attached drawings.

According to the invention an electric charge is electrically inserted into the potential well of an image pick-up element. In this case, however, the electric charge is not directly used as a bias charge, but is once injected in a bulk. The injected charge is diffused, mostly flowed to the substrate of the image pick-up element, recombined at the recombination center and then disappeared or decayed. In this case, within a certain period of time, there is such a state wherein the charge which is decaying is averaged and remains in the bulk. At this time, if a potential well is formed on the surface of the substrate again, the charge, which is decaying and averaged or made uniform, is partially caught through diffusion within the potential well. The charge thus caught is used as the bias charge of fat "0". The bias charge thus obtained is uniform, and by controlling its injection period the amount of fat "0" can be also controlled.

Now, with reference to FIG. 2 (operation state diagram) and FIG. 3 (drive pulse waveform diagram) an example of the present invention will be described.

Figure 1A:
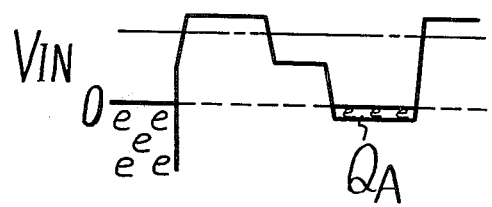
FIGS. 1A and 1B are respectively potential diagrams used to explain the present invention.
Figure 1B:
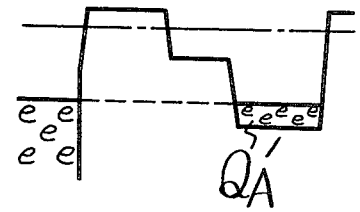
Figure 3A:
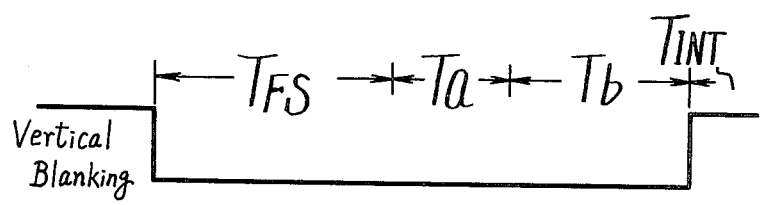
FIGS. 3A to 3E are respectively waveforms of drive pulses used to explain the invention.
Figure 3B:
Figure 3C:
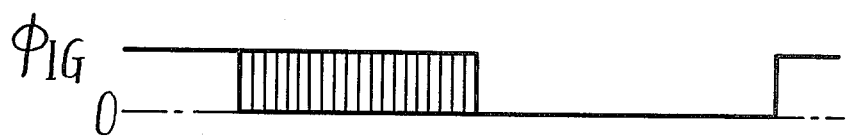
Figure 3D:
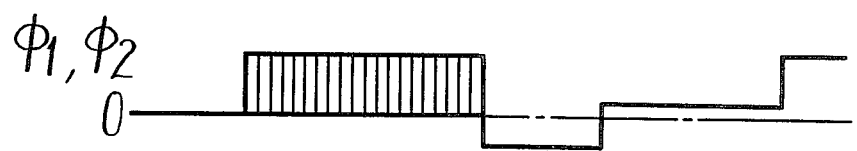
Figure 3E:
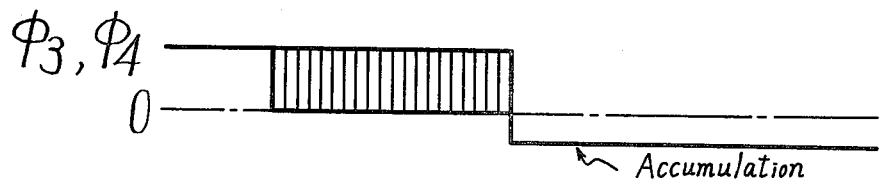
Figure 2A:
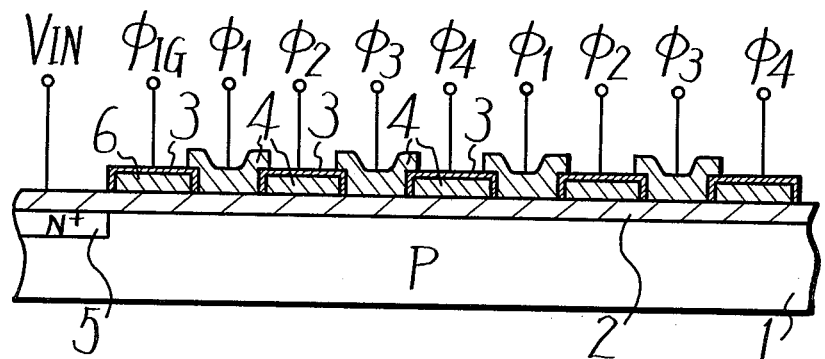
FIG. 2A is a cross-sectional view showing the image portion of an example of a CCD solid state image pick-up element to which an example of the present invention is applied.

FIG. 2A shows the image portion of a surface channel type CCD solid state image pick-up element of a frame transfer system which is driven at a 4-phase. In FIG. 2A, 1 designates, for example, a silicon semiconductor substrate of a first conductivity type, for example, P-conductivity type on one of the major surfaces of which coated is a gate insulating layer 2 made of $SiO_2$ or the like. On the gate insulating layer 2 located a plurality of transfer electrodes 4, each being separated by an insulating layer 3 and elongated along the charge transfer direction to form a charge transfer portion of CCD. Every four transfer electrodes 4 are connected together and supplied with clock voltages $\phi_1$, $\phi_2$, $\phi_3$ and $\phi_4$ of 4 phases, respectively. A diffusion layer 5 of a second conductivity type i.e. $N^+$ conductivity type is provided in the substrate 1 as an input portion and an input gate electrode 6 is formed between the input portion and the charge transfer portion through the gate insulating layer 2. The diffusion layer 5 is supplied with an input voltage $V_{IN}$ and the input gate electrode 6 is supplied with an input gate voltage $\phi_{IG}$, respectively. In this case, the clock voltages $\phi_1$ and $\phi_2$ are applied with the same phase, and the clock voltages $\phi_3$ and $\phi_4$ are applied with the same phase, respectively. Further, by making the impurity concentration of the surface of the substrate 1 beneath the electrodes 4 supplied with, for example, clock voltages $\phi_1$ and $\phi_3$ different from the impurity concentration of the surface of the substrate 1 beneath the electrodes 4 supplied with the clock voltages $\phi_2$ and $\phi_4$ or the like and when the clock voltages $\phi_1$ and $\phi_2$ and those $\phi_3$ and $\phi_4$ are applied to the electrodes 4, asymmetrical potentials with respect to the charge transfer direction are generated.

Figure 2B:
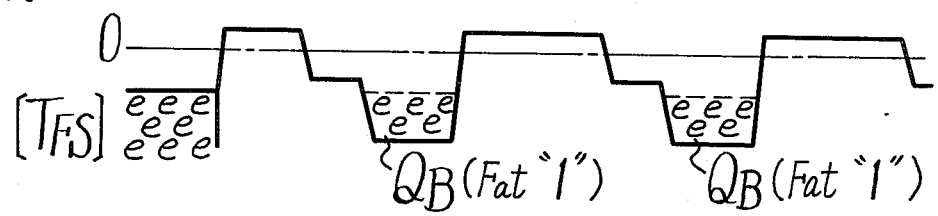
FIGS. 2B to 2E are respectively schematic diagrams showing variations of the potential wells generated in the image pick-up element which are each used to explain the operation of the invention.

When the clock voltages $\phi_1$ and $\phi_2$ and those $\phi_3$ and $\phi_4$ are applied to the respective transfer electrodes 4 of the image portion constructed as above in a frame shift period $T_{FS}$ within the vertical blanking period shown in FIG. 3 to transfer the signal charge of one field from the image portion to a charge storing portion, at the same time the clock voltage $\phi_{IG}$ is applied to the input gate electrode 6 so as to introduce, under the respective transfer electrodes 4 being driven, a charge amount $Q_B$ of fat "1", which is substantially same amount as maximum handling charge of charge storing portion from the diffusion layer 5 at the input portion supplied with the input voltage $V_{IN}$, to the image portion or the portion beneath the transfer electrodes 4 supplied with the clock voltage $\phi_2$ in the example of FIG. 2B. At this state, although there is the difference between the fat "1" and fat "0" as shown in FIGS. 1A and 1B, due to the scattering of the surface potential at the input gate portion there is scattering in the charge amounts $Q_B$ introduced to the respective registers. In this case, the charge amount $Q_B$ of fat "1" can be controlled desirably by the relative potential of the diffusion layer 5 to that of the input gate portion.

Figure 2C:
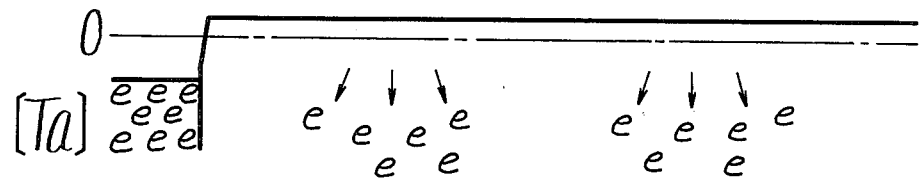

During the following period $T_a$ after the period $T_{FS}$, all the stages (transfer regions) are made in the accumulation state or such a voltage is applied to all the transfer electrodes 4 to make the surface areas therebeneath in the accumulation state to thereby inject all of charge $Q_B$ of fat "1" into the substrate 1 (refer to FIGS. 2C and 3). The period $T_a$ is within the life time of the charge $Q_B$ and hence the injected charge $Q_B$ is made uniform during the decay time thereof and exists in the substrate 1.

Figure 2D:
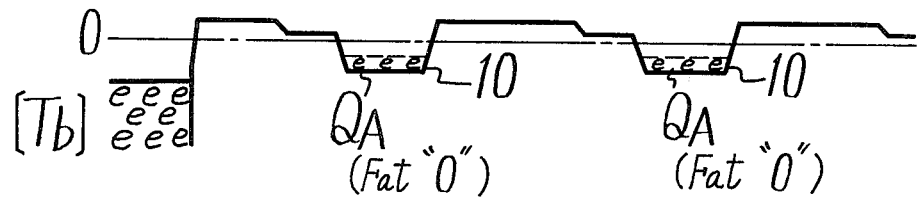

In the time period after the period $T_a$ or period $T_b$, a necessary voltage is applied to the stage which will receive light in the next field or the transfer electrode 4 supplied with the clock voltage $\phi_2$ in the example to produce the potential well 10 beneath this electrode 4 as shown in FIG. 2D. Thus, a part of the charge uniformly remaining in the substrate 1 is caught by the potential well 10 and the caught charge is then used as the bias charge $Q_A$ of fat "0". The bias charge $Q_A$ caught as above is uniform through the stages of the respective registers. In this case, the above necessary voltage is selected such that the surface regions beneath the electrodes 4 simultaneously supplied with the clock voltage $\phi_2$ each become a weak depletion state as shown in FIG. 2D.

Figure 2E:
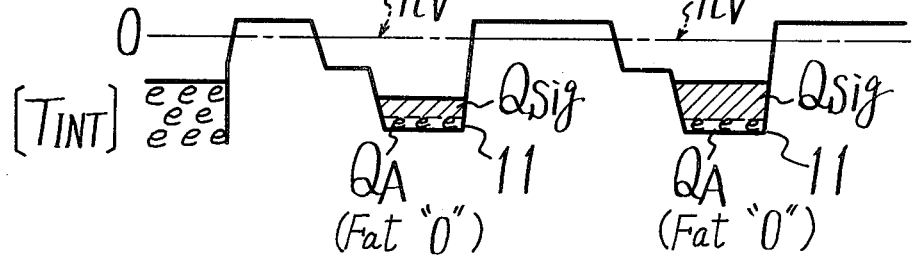

Then, a light receiving period $T_{INT}$ of the image portion arrives for a potential well 11 to accumulate therein a signal charge $Q_{sig}$ corresponding to the incident light amount as shown in FIG. 2E.

As described above, according to the present invention, the charge more than the bias charge of fat "0" is introduced to the image portion within the frame shift period $T_{FS}$ in the blanking period, the charge thus introduced is once injected to the substrate to make the charge uniform therein, and the charge thus made uniform is caught by the light receiving stage again to use the caught charge as fat "0" so that the fat "0" can be uniformly introduced to the respective stages and hence the fixed pattern noise can be reduced in the CCD solid state image pick-up element.

In the above case, the present invention is applied to the image portion of 4-phase drive type, but it will be apparent that the present invention can be applied to the image portion of 3-phase or 2-phase drive type with the same effect.

The above description is given on a single preferred embodiment of the invention, but it will be apparent that many modifications and variations could be effected by one skilled in the art without departing from the spirits or scope of the novel concepts of the invention, so that the scope of the invention should be determined by the appended claims only.

We claim as our invention:

1. In a charge transfer device in which a plurality of electrodes are located on an insulating layer on a semiconductor substrate and an input portion and a transfer portion are provided, said charge transfer device, comprising:
    (a) means for introducing a predetermined amount of charge determined by a potential applied to the input portion into a portion beneath a predetermined electrode while driving an electrode on the transfer portion;
    (b) means for applying such a potential to all of said plurality of electrodes that surface areas beneath said electrodes each become an accumulation state to thereby inject all of charge into said substrate;

(c) means for applying a potential to said electrodes after a predetermined period of time to partially catch injected charge beneath said electrodes and to use caught charge as a bias charge.

2. A solid state image pick-up apparatus, comprising:
(a) a semiconductor substrate coated with an insulating layer on its one surface;
(b) a plurality of electrodes located on said insulating layer;
(c) an input portion;
(d) a transfer portion;
(e) means for introducing a predetermined amount of charge determined by a potential applied to the input portion into a portion beneath a predetermined electrode while driving an electrode on the transfer portion;
(f) means for applying such a potential to all of said plurality of electrodes that surface areas beneath said electrodes each become an accumulation state to thereby inject all of charge into said substrate; and
(g) means for applying a potential to said electrodes after a predetermined period of time to partially catch injected charge beneath said electrodes and to use caught charge as a bias charge, wherein said three means carry out operations thereof in a vertical blanking period.

* * * * *